(12) United States Patent
Maejima

(10) Patent No.: US 8,036,010 B2
(45) Date of Patent: Oct. 11, 2011

(54) SEMICONDUCTOR MEMORY DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 12/403,781

(22) Filed: Mar. 13, 2009

(65) Prior Publication Data

US 2009/0230435 A1    Sep. 17, 2009

(30) Foreign Application Priority Data

Mar. 17, 2008 (JP) ................... 2008-068423

(51) Int. Cl.
*G11C 5/02* (2006.01)
(52) U.S. Cl. .......................... 365/51; 365/158
(58) Field of Classification Search .............. 365/51, 365/158

See application file for complete search history.

(56) References Cited

U.S. PATENT DOCUMENTS

| 6,972,985 B2 * | 12/2005 | Rinerson et al. ............. 365/148 |
| 2006/0023495 A1 * | 2/2006 | Rinerson et al. ............. 365/158 |

FOREIGN PATENT DOCUMENTS

| JP | 2007-12160 | 1/2007 |
| JP | 2007-536680 | 12/2007 |
| WO | WO 02/078001 A2 | 10/2002 |

OTHER PUBLICATIONS

U.S. Appl. No. 12/708,822, filed Feb. 19, 2010, Tokiwa, et al.
Office Action issued Nov. 2, 2010 in JP Application No. 2008-068423 (With English Translation).
Mark Johnson, et al., "512-Mb PROM With a Three-Dimensional Array of Diode/Antifuse Memory Cells", IEEE Journal of Solid-State Circuits, vol. 38, No. 11, Nov. 2003, pp. 1920-1928.

* cited by examiner

*Primary Examiner* — Michael Tran
(74) *Attorney, Agent, or Firm* — Oblon, Spivak, McClelland, Maier & Neustadt, L.L.P.

(57) ABSTRACT

A semiconductor memory device comprises a semiconductor substrate; a plurality of memory cell arrays stacked on the semiconductor substrate, each memory cell array including a plurality of first lines paralleled with each other, a plurality of second lines paralleled with each other and formed crossing the first lines, and a plurality of memory cells arranged at intersections of the first lines and the second lines, each memory cell having one end connected to the first line and the other end connected to the second line; a first control circuit provided on the semiconductor substrate immediately beneath the memory cell arrays and having one end connected to the first line to select and drive the first line; and a second control circuit provided on the semiconductor substrate immediately beneath the memory cell arrays and having one end connected to the second line to select and drive the second line.

19 Claims, 13 Drawing Sheets

(a) [x-z section along WL]    (b) [y-z section along BL]

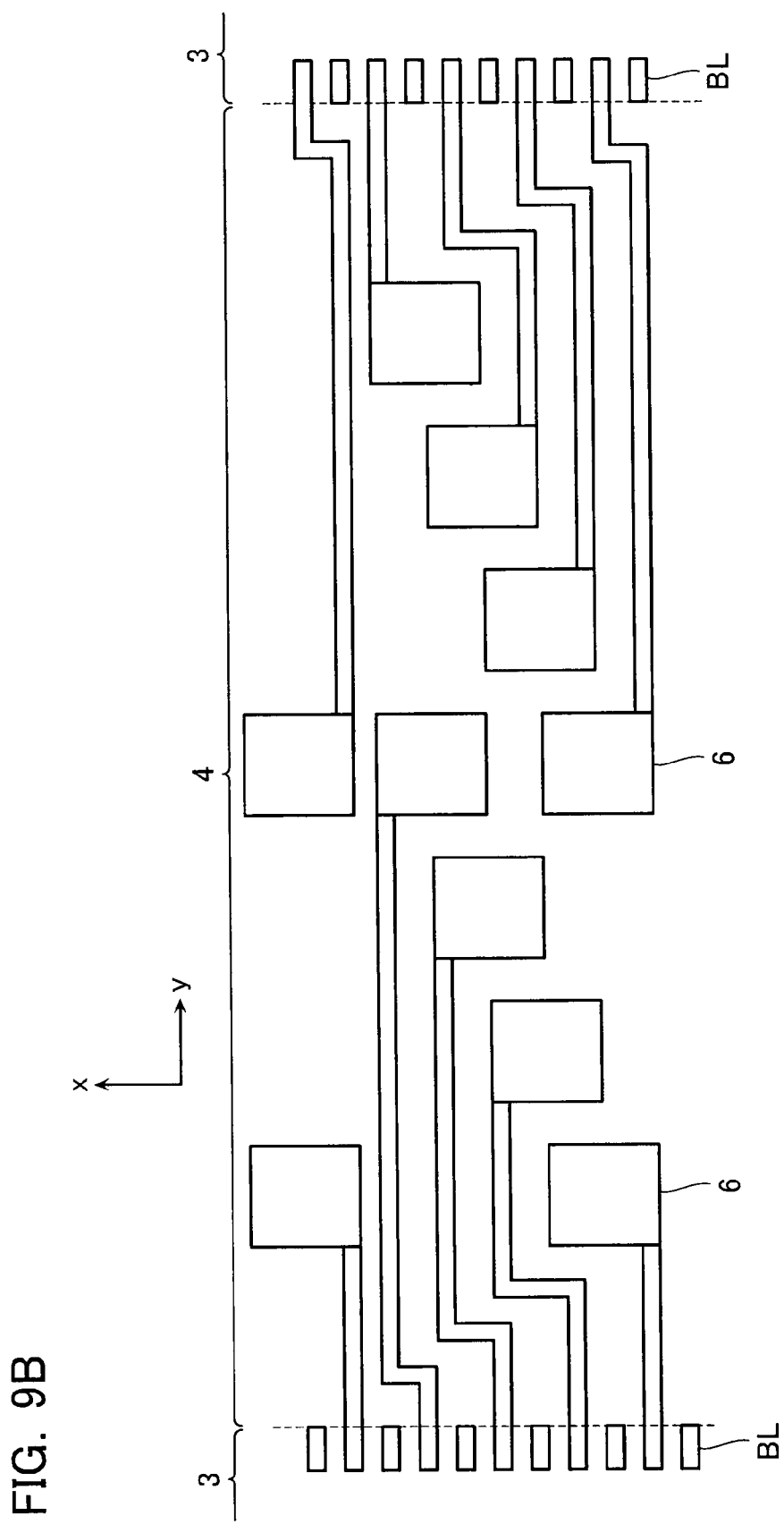

SEMICONDUCTOR MEMORY DEVICE

CROSS-REFERENCE TO RELATED APPLICATION

This application is based upon and claims the benefit of priority from prior Japanese Patent Application No. 2008-68423, filed on Mar. 17, 2008, the entire contents of which are incorporated herein by reference.

BACKGROUND OF THE INVENTION

1. Field of the Invention

The present invention relates to a semiconductor memory device, and more particular to a semiconductor memory device having a structure of memory cell arrays stacked on a semiconductor substrate.

2. Description of the Related Art

In recent years, attention has been focused on resistive memories as successive candidates for flash memories. The resistive memory devices include a resistive memory (ReRAM: Resistive RAM) in a narrow sense, which uses a transition metal oxide as a recording layer to nonvolatilely store the resistance value state thereof, and a phase change memory (PCRAM: Phase Change RAM), which uses a chalcogenide or the like as a recording layer to utilize the resistance value information on the crystalline state (conductor) and the amorphous state (insulator).

A variable resistor in the resistive memory has been known to have two types of operation modes. One is designed to switch the polarity of the applied voltage to set a high-resistance state and a low-resistance state. This is referred to as the bipolar type. The other is designed to control the voltage value and the voltage applying time without switching the polarity of the applied voltage. This is referred to as the unipolar type.

The unipolar type is preferable to realize a high-density memory cell array. This is because in the unipolar type a variable resistor and a rectifier such as a diode can be stacked at an intersection of a bit line and a word line to configure a cell array with the use of no transistor. Further, such cell arrays can be stacked and arrayed three-dimensionally to realize a high capacity without increasing the cell array area.

Generally, in a semiconductor memory, a bit line in a memory cell array is connected to a column-related control circuit including a bit line selector and a sense amplifier. In addition, a word line in the memory cell array is connected to a row-related control circuit including a row decoder and a word line driver. The semiconductor memory having a structure of three-dimensional memory cell arrays of the cross-point type, such as the resistive memories, stacked on a semiconductor substrate has a subject on how efficiently these control circuits can be arranged beneath the memory cell array to minimize the chip area.

Mark Johnson et al., "512-Mb PROM with a three-dimensional array of diode/antifuse memory cells", IEEE Journal of Solid-State Circuits, November 2003, Vol. 38, No. 11, p. 1920-1928 discloses an arrangement of only one of the column-related control circuit or the row-related control circuit beneath one memory block in a semiconductor memory including memory blocks having the memory cell array structure stacked on a semiconductor substrate. The column-related control circuit or the row-related control circuit beneath the memory block is used to control a memory block located above or a memory block adjacent thereto.

SUMMARY OF THE INVENTION

In an aspect the present invention provides a semiconductor memory device, comprising: a semiconductor substrate; a plurality of memory cell arrays stacked on the semiconductor substrate, each memory cell array including a plurality of first lines paralleled with each other, a plurality of second lines paralleled with each other and formed crossing the first lines, and a plurality of memory cells arranged at intersections of the first lines and the second lines, each memory cell having one end connected to the first line and the other end connected to the second line; a first control circuit provided on the semiconductor substrate immediately beneath the memory cell arrays and having one end connected to the first line to select and drive the first line; and a second control circuit provided on the semiconductor substrate immediately beneath the memory cell arrays and having one end connected to the second line to select and drive the second line.

In another aspect the present invention provides a semiconductor memory device, comprising: a semiconductor substrate; a plurality of memory cell arrays stacked on the semiconductor substrate, each memory cell array including a plurality of first lines paralleled with each other, a plurality of second lines paralleled with each other and formed crossing the first lines, and a plurality of memory cells arranged at intersections of the first lines and the second lines, each memory cell having one end connected to the first line and the other end connected to the second line; a first control circuit provided on the semiconductor substrate and having one end connected to the first line to select and drive the first line; and a second control circuit provided on the semiconductor substrate and having one end connected to the second line to select and drive the second line, wherein the first control circuit and the second control circuit are arranged in a checkerboard form on the semiconductor substrate immediately beneath the memory cell arrays.

In yet another aspect the present invention provides a semiconductor memory device, comprising: a semiconductor substrate; a plurality of memory cell arrays stacked on the semiconductor substrate, each memory cell array including a plurality of first lines paralleled with each other, a plurality of second lines paralleled with each other and formed crossing the first lines, and a plurality of memory cells arranged at intersections of the first lines and the second lines, each memory cell having one end connected to the first line and the other end connected to the second line; a first control circuit provided on the semiconductor substrate and having one end connected to the first line to select and drive the first line; a second control circuit provided on the semiconductor substrate and having one end connected to the second line to select and drive the second line; a plurality of line contact areas provided adjacent to four sides of an area immediately beneath the memory cell array; a plurality of first line contacts provided in the line contact areas to connect the first lines to the first control circuit; and a plurality of second line contacts provided in the line contact areas to connect the second lines to the second control circuit, wherein the first line contacts connected to the first lines aligned in parallel are provided on every other one of the first lines within one of the line contact areas, wherein the second line contacts connected to the second lines arranged in parallel are provided on every other one of the second lines within one of the line contact areas.

BRIEF DESCRIPTION OF THE DRAWINGS

FIGS. 9A and 9B provide plan views illustrative of arrangement examples of line contacts in the resistive memory device.

DETAILED DESCRIPTION OF THE EMBODIMENTS

The embodiments of the present invention will now be described with reference to the accompanying drawings.

First Embodiment

Figure 1:
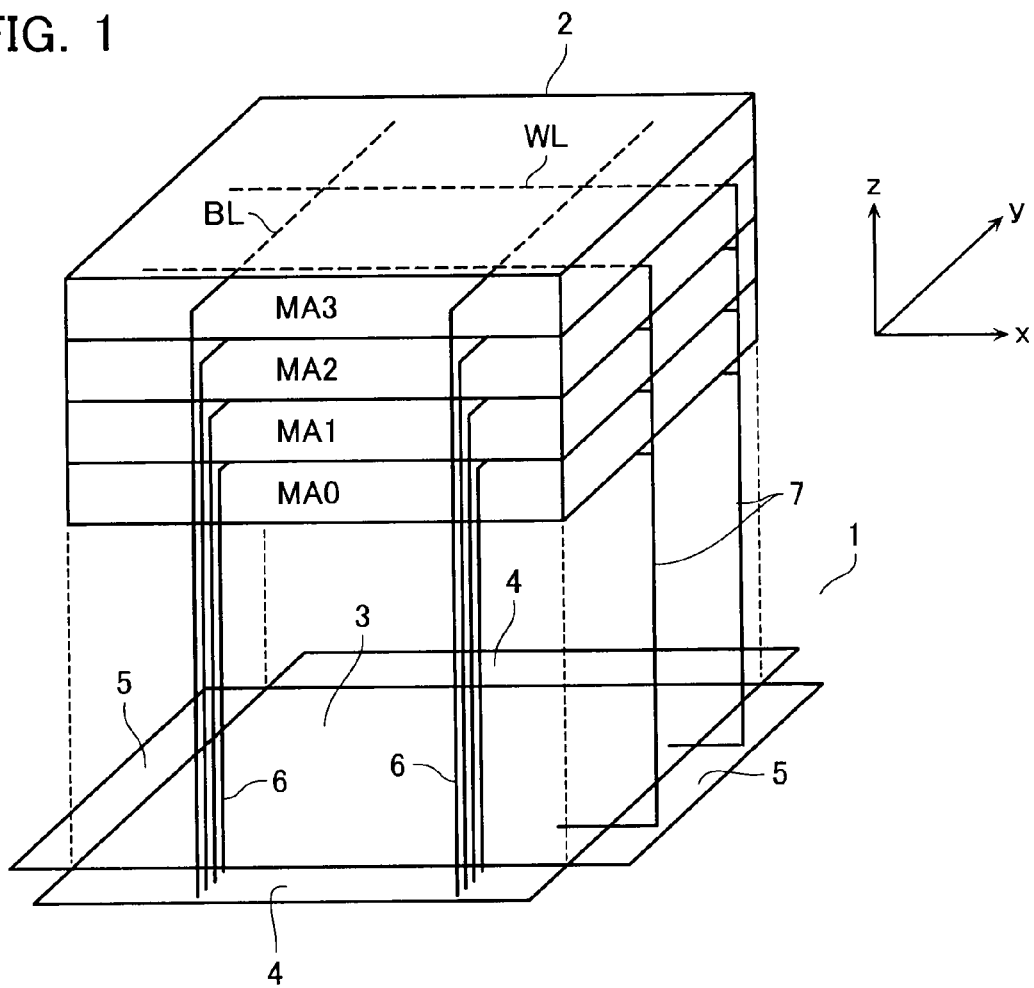
FIG. 1 is a perspective view showing a configuration of a resistive memory device.

FIG. 1 shows a basic configuration of a resistive memory device according to a first embodiment of the present invention, that is, a configuration on a semiconductor substrate 1, including a control circuit area 3 for use in formation of column-related/row-related control circuits therein, and a memory block 2 stacked thereon.

Figure 2:
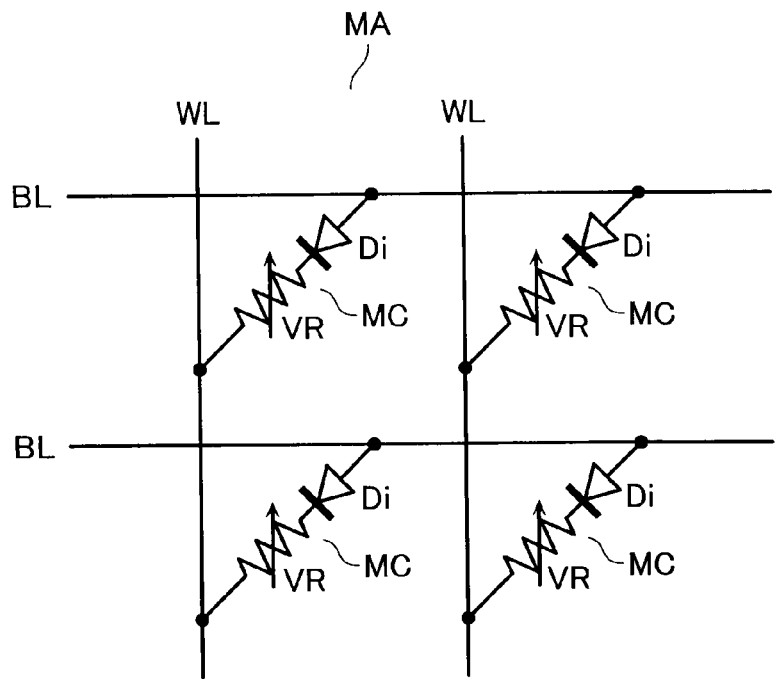
FIG. 2 is a circuit diagram showing an equivalent circuit of a unit memory cell in the resistive memory device.

The memory block 2 includes four-layered memory cell arrays MA0-MA3. In one memory cell array MA, unit memory cells MC are arrayed in two-dimensional matrix. FIG. 2 shows an equivalent circuit of the memory cell array MA. As shown, arranged at intersections of word lines WL and bit lines BL are the resistive memory cells MC, each including an accessible element, such as a diode Di, and a variable resistor VR serially connected. The variable resistor VR has an electrode/transition-metal-oxide/electrode structure, for example, and results in a variation in resistance of the metal oxide in accordance with the condition of applied voltage, current, heat or the like, thereby nonvolatilely storing different states of the resistance as information. More specifically, available examples of the variable resistor include: one that changes the resistance in accordance with a phase change between the crystalline state and the amorphous state, such as a chalcogenide (PCRAM); one that changes the resistance by precipitating metal cations to form a bridge (contacting bridge) between electrodes and ionizing the precipitated metal to destruct the bridge (CBRAM: Conductive Bridging RAM); and one that changes the resistance by applying a voltage or current (ReRAM) (which is roughly divided into two: one that causes a variation in resistance in accordance with the presence/absence of charge trapped in charge traps present in the electrode interface, and one that causes a variation in resistance in accordance with the presence/absence of the conduction path due to an oxygen loss and so forth). The memory cell MC has a stable state (reset state), which is a high-resistance state or a low-resistance state, and in the case of binary data storage, for example, data is written by setting the reset state to the low-resistance state or the high-resistance state.

Figure 3:
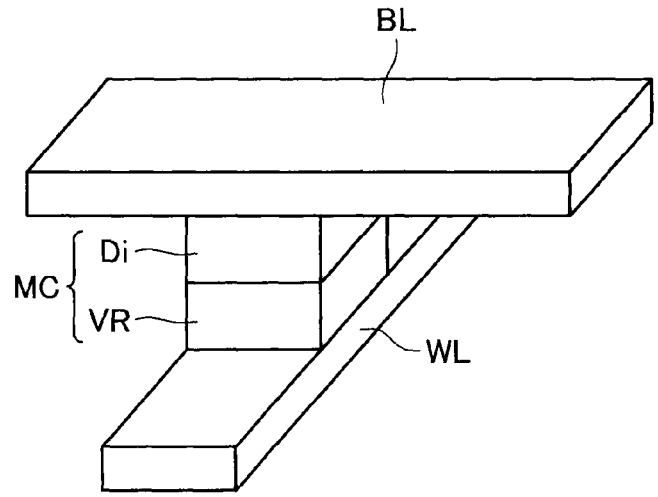
FIG. 3 is a perspective view showing a stacked structure of the unit memory cell in the resistive memory device.

A unit memory cell MC has a stacked structure as shown in FIG. 3. Stacked at an intersection of a word line WL and a bit line BL are the variable resistor VR and the accessible element or the diode Di contained in the memory cell MC.

As shown in FIG. 1, the control circuit area 3 is provided on the semiconductor substrate 1 immediately beneath the memory block 2. Formed in the control circuit area 3 are a column-related control circuit including a bit line selector and a sense amplifier, and a row-related control circuit including a row decoder and a word line driver, for example.

Connections of the word lines WL and bit lines BL in the stacked memory cell arrays MA to the control circuits formed on the semiconductor substrate 1 require vertical lines (via-contacts) on the sides of the memory block 2. Bit line contact areas 4 and word line contact areas 5 are provided along the four sides of the control circuit area 3. Formed in the bit line contact areas 4 and word line contact areas 5 are bit line contacts 6 and word line contacts 7 for use in connections of the bit lines BL and word lines WL to the control circuits. The word lines WL have one end connected to the control circuit area 3 via the word line contacts 7 formed in the word line contact areas 5. The bit lines BL have one end connected to the control circuit area 3 via the bit line contacts 6 formed in the bit line contact areas 4.

FIG. 1 shows one memory block 2 including plural memory cell arrays MA stacked in the z-direction. In practice, plural such unit memory blocks 2 are arranged in matrix in the direction along the word line WL (x-direction) and in the direction along the bit line BL (y-direction).

Figure 4:
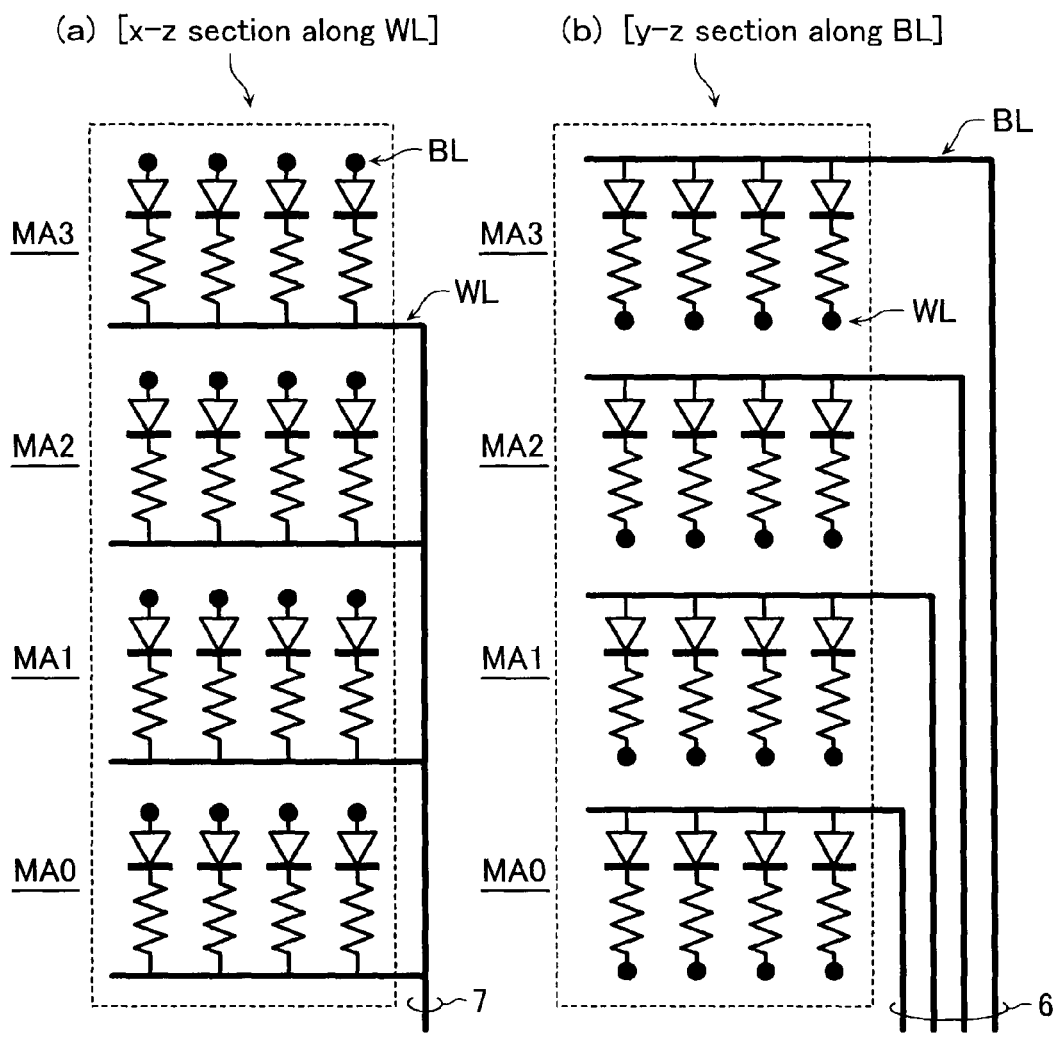
FIG. 4 provides cross-sectional views showing a configuration of bit line contacts and word line contacts in the resistive memory device.

The condition of the bit lines BL and word lines WL shared by the cell arrays in the memory block 2 and the relation between the bit line contacts 6 and the word line contacts 7 are described with reference to FIG. 4. FIG. 4 is an x-z section of the memory block 2 taken along the word line WL, and is a y-z section taken along the bit line BL, which show examples of contacts configured for the word lines WL and bit lines BL.

As shown in FIG. 4, in the present embodiment, only one of word line contacts 7, that is, a common contact in the word line contact area 5 connects the word lines WL in all the layers in one section to the control circuit area 3. In the bit line contact area 4, the bit lines BL in each of the layers are connected to the control circuit area 3 via four bit line contacts 6 separately prepared.

In the present embodiment, the bit lines BL are independently driven on a layer basis while the word lines WL are commonly connected in all the layers, though the word lines WL may also be independently driven on a layer basis. Alternatively, the bit lines BL may be commonly connected while the word lines WL are independently driven. The bit line BL and the word line WL may be configured such that at least one of them is shared by the upper and lower layers. In this case, the upper and lower memory cells MC are arranged symmetric about the common line. The arrangement and polarity of the diode Di and the variable resistor VR contained in the memory cell MC are not limited to the shown example.

(First Arrangement Example of Control Circuits)

The following description is given to an arrangement of column-related control circuits and row-related control circuits provided beneath the memory block 2 thus configured.

Figure 5:
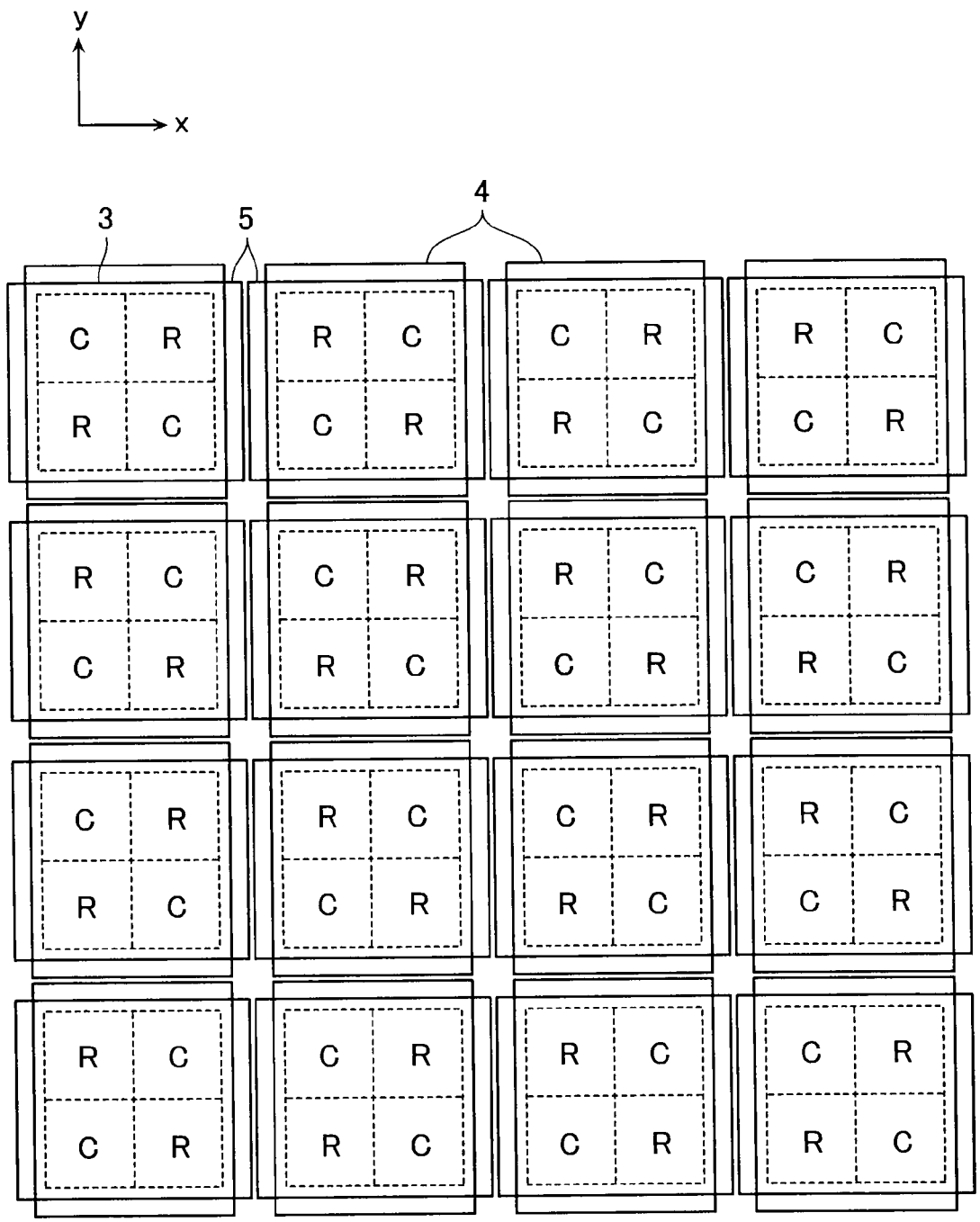
FIG. 5 is a plan view illustrative of an arrangement example of column-related/row-related control circuits in the resistive memory device.

FIG. 5 is a plan view showing an example of the arrangement of the column-related control circuits C and the row-related control circuits R in the control circuit area 3. FIG. 5 shows a layout of plural control circuit areas 3 beneath the memory block 2, including the contact areas.

As shown in FIG. 5, in the control circuit areas 3 beneath one memory block 2, both of the column-related control circuits C each including a bit line selector and a sense amplifier and the row-related control circuits R each including a row decoder and a word line driver are formed. In one control circuit area 3, the column-related control circuits C and the row-related control circuits R are aligned on respective diagonal lines and arranged in a checkerboard form in the control circuit area 3. Provided around the control circuit area 3 are bit line contact areas 4 and word line contact areas 5 in which contacts are formed to connect the bit line BL or the word line WL to the column-related control circuits C and the row-related control circuits R.

If the column-related control circuits C are formed as one circuit block and the row-related control circuits R are in the same way, both circuit blocks can not be arranged in the control circuit area 3 at the same time because they overlap in part. In contrast, if the column-related control circuits C are divided into two and the row-related control circuits R into another two in this way, and arranged in a checkerboard form, the column-related control circuits C in the state of covering all the bit lines BL in the column direction and the row-related control circuits R in the state of covering all the word lines WL in the row direction can be contained in the control circuit area 3.

The column-related control circuits C and the row-related control circuits R formed in two adjacent control circuit areas 3 are arranged in checkerboard forms in different patterns. Namely, in two control circuit areas 3 that are adjacent to each other, the column-related control circuits C and the row-related control circuits R are formed line-symmetric about the boundary of the areas as the axis of symmetry.

The following description is given to connection lines between the column-related control circuits C and row-related control circuits R thus arranged and the memory block 2.

Figure 6:
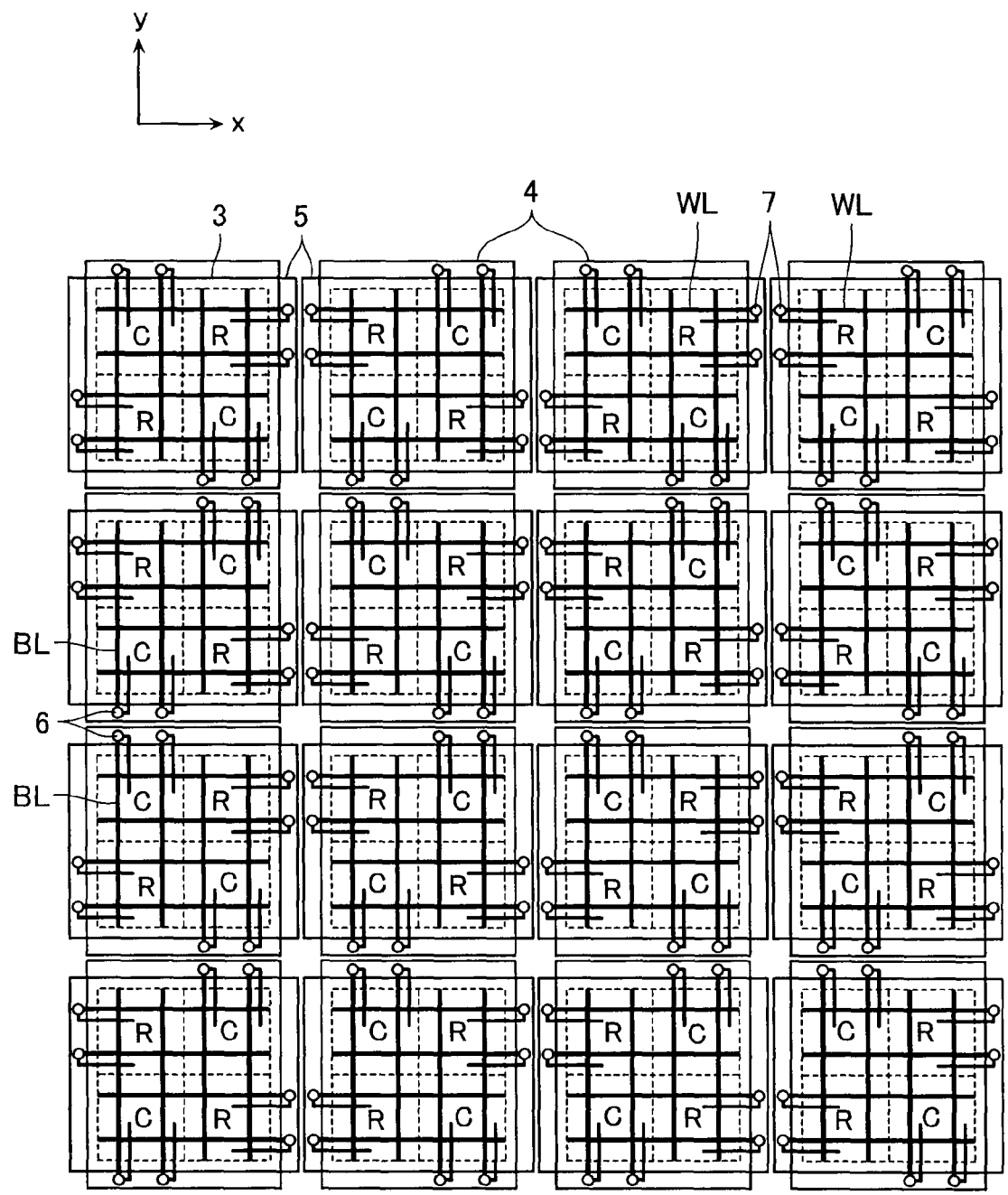
FIG. 6 is a plan view illustrative of an arrangement example of column-related/row-related control circuits in the resistive memory device.

FIG. 6 shows lines for connecting the column-related control circuits C and row-related control circuits R formed in the control circuit area 3 to the memory block 2.

The bit line contacts 6 are formed in the bit line contact areas 4 adjacent to the column-related control circuits C among the column-related control circuits C and the row-related control circuits R arranged in a checkerboard form in one control circuit area 3. The bit lines BL in the memory block 2 formed on the control circuit area 3 are connected via the bit line contacts 6 to the column-related control circuits C located beneath.

The bit line contacts 6 are formed on locations adjacent to the column-related control circuits C in the bit line contact areas 4. Accordingly, in one bit line contact area 4, the bit line contacts 6 are formed concentratively only in one-half of the area.

Two column-related control circuits C formed in a checkerboard form are used to select and drive the bit lines BL in one memory block 2, of which one-half and the remaining half are connected to the respective column-related control circuits C within the bit line contact areas 4 on the opposite sides.

Similarly, the word line contacts 7 are formed in the word line contact areas 5 adjacent to the row-related control circuits R among the column-related control circuits C and the row-related control circuits R arranged in a checkerboard form. The word lines WL in the memory block 2 formed on the control circuit area 3 are connected via the word line contacts 7 to the row-related control circuits R located beneath.

The word line contacts 7 are formed on locations adjacent to the row-related control circuits R in the word line contact areas 5. Accordingly, in one word line contact area 5, the word line contacts 7 are formed concentratively only in one-half of the area.

Two row-related control circuits R formed in a checkerboard form are used to select and drive the word lines WL in one memory block 2, of which one-half and the remaining half are connected to the row-related control circuits R within the word line contact areas 5 on the opposite sides.

With such the arrangement of the control circuits, the column-related control circuits C and the row-related control circuits R are provided beneath one memory block 2, and plural memory blocks 2 can be controlled independently by the column-related control circuits C/row-related control circuits R provided per memory block 2. In addition, there is no need for separately providing a control circuit operative to control the memory block 2 at the outermost circumference and thus the chip area can be reduced.

(Another Example 1 of Connection Lines)

Figure 7:
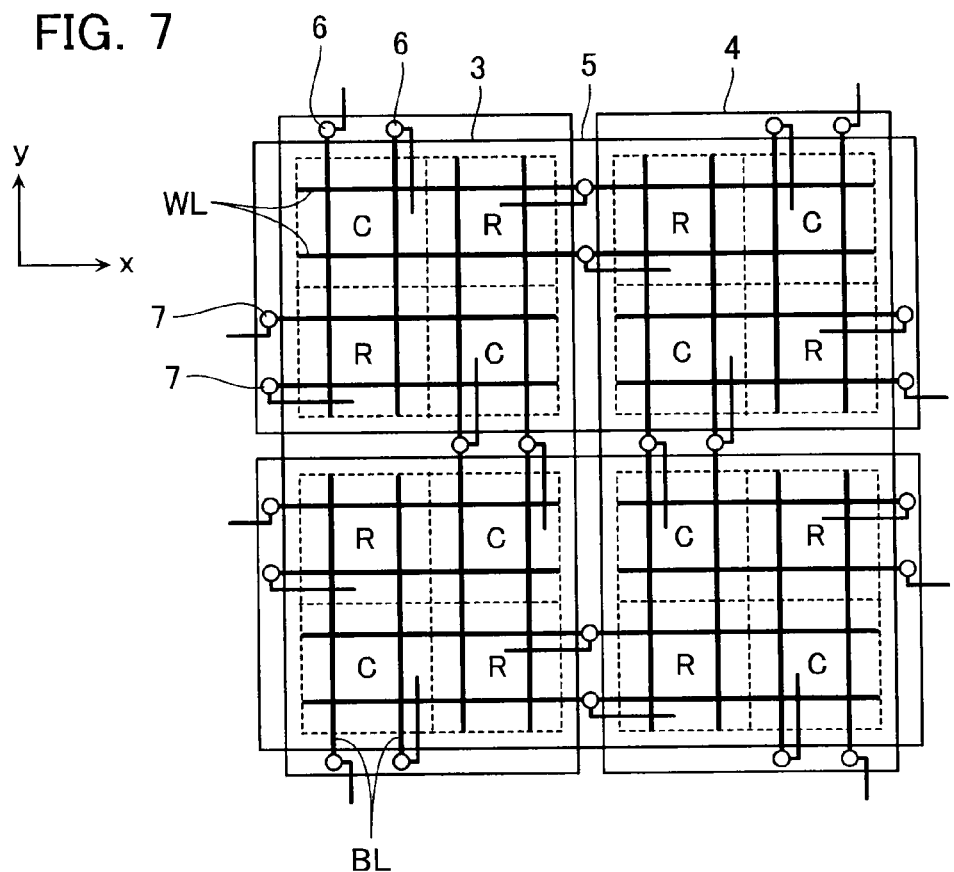
FIG. 7 is a plan view illustrative of an arrangement example of column-related/row-related control circuits in the resistive memory device.

The following description is given to another example of connection lines between the column-related control circuits C and row-related control circuits R arranged in a checkerboard form and the memory block 2. FIG. 7 shows lines for connecting the column-related control circuits C and row-related control circuits R formed in the control circuit area 3 to the memory block 2.

The bit line contacts 6 are formed in the bit line contact areas 4 adjacent to the column-related control circuits C among the column-related control circuits C and the row-related control circuits R arranged in a checkerboard form in one control circuit area 3. The bit lines BL in the memory block 2 formed on the control circuit area 3 are connected via the bit line contacts 6 to the column-related control circuits C located beneath.

The bit lines BL are disposed on a memory block 2 provided immediately above the column-related control circuits C connected via the bit line contacts 6 and extended to another memory block 2 adjacent to the above memory block 2 with the bit line contact 6 interposed therebetween. The bit lines BL commonly provided on two memory blocks 2 are commonly selected and driven by one column-related control circuit C. Namely, one column-related control circuit C is shared between memory cell arrays provided in adjacent memory blocks 2.

Similarly, the word line contacts 7 are formed in the word line contact areas 5 adjacent to the row-related control circuits R among the column-related control circuits C and the row-related control circuits R arranged in a checkerboard form in one control circuit area 3. The word lines WL in the memory block 2 formed on the control circuit area 3 are connected via the word line contacts 7 to the row-related control circuits R located beneath.

The word lines WL are disposed on a memory block 2 provided immediately above the row-related control circuits R connected via the word line contacts 7 and extended to another memory block 2 adjacent to the above memory block 2 with the word line contact 7 interposed therebetween. The word lines WL commonly provided on two memory blocks 2 are commonly selected and driven by one row-related control circuit R. Namely, one row-related control circuit R is shared between memory cell arrays provided in adjacent memory blocks 2.

With such the arrangement of the lines, a bit line driver and a word line driver for driving the bit lines BL and the word lines WL can be shared by two memory blocks 2. Therefore, the numbers and areas of bit line drivers and word line drivers can be reduced.

(Another Example 2 of Connection Lines)

Figure 8:
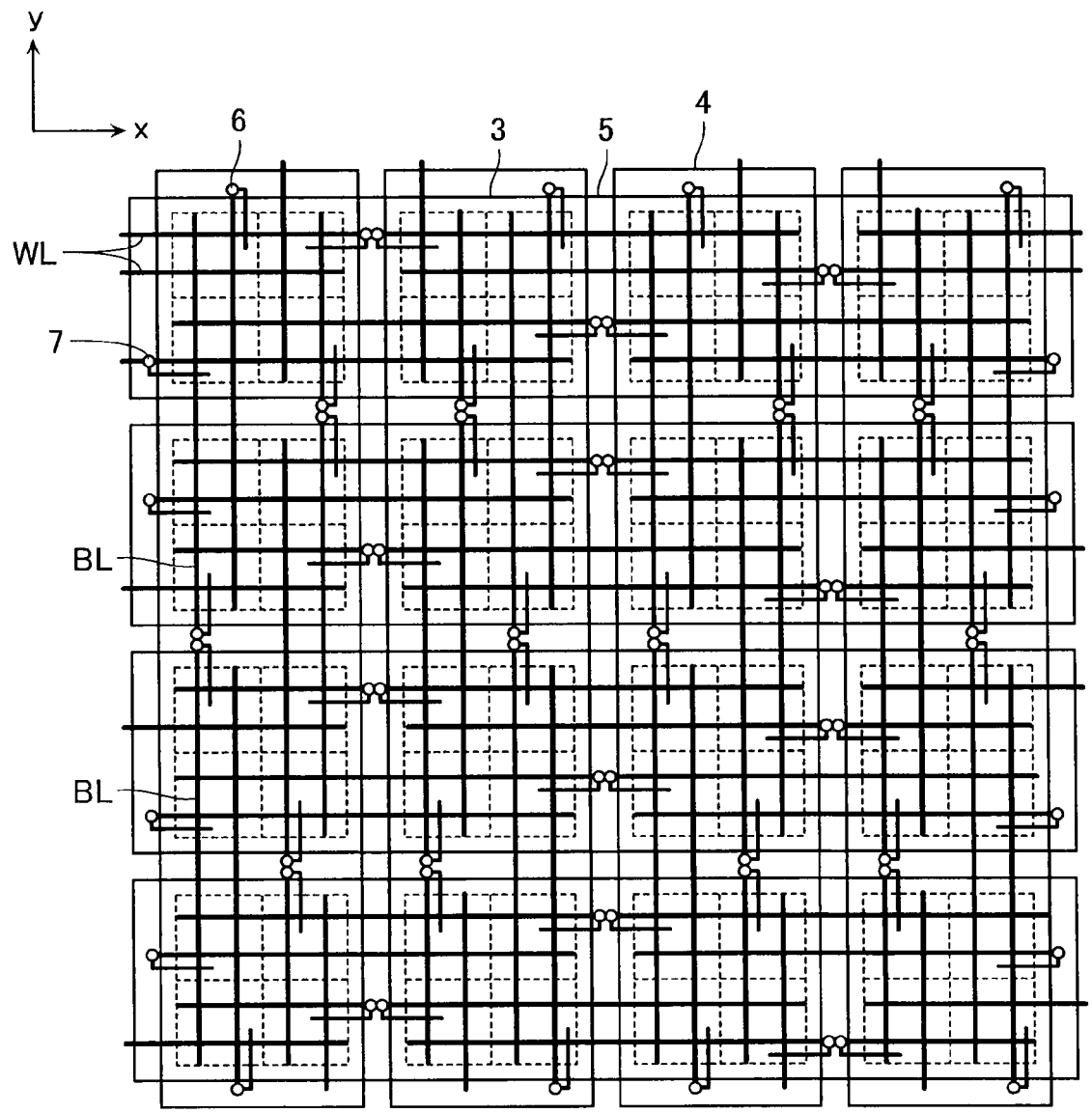
FIG. 8 is a plan view illustrative of an arrangement example of column-related/row-related control circuits in the resistive memory device.

The following description is given to yet another example of connection lines between the column-related control circuits C and row-related control circuits R arranged in a checkerboard form and the memory block 2. FIG. 8 shows lines for connecting the column-related control circuits C and row-related control circuits R formed in the control circuit area 3 to the memory block 2. In FIG. 8 the symbols (C, R) denoting the column-related control circuits C and the row-related control circuits R are omitted from the figure, though the arrangement of the column-related control circuits C and the row-related control circuits R is similar to those in FIGS. 6 and 7.

The bit lines BL are disposed on a memory block 2 provided immediately above the column-related control circuits C connected via the bit line contacts 6 and extended to an adjacent memory block 2 on the opposite side. The bit lines BL commonly provided on two memory blocks 2 are commonly selected and driven by one column-related control circuit C. Namely, one column-related control circuit C is shared between memory cell arrays provided in adjacent memory blocks 2.

When the bit lines BL are connected in this way, the bit line contacts 6 formed in one bit line contact area 4 are provided at every other one of plural bit lines BL aligned in parallel.

Figure 9A:
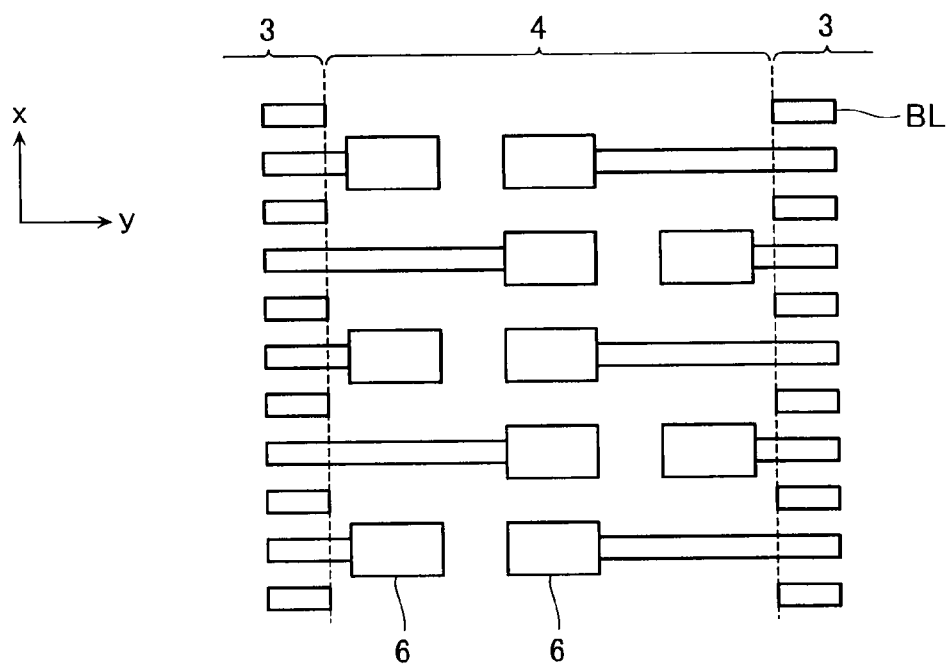

FIGS. 9A and 9B are plan views showing arrangement examples of bit line contacts 6 provided at every other one of plural bit lines BL. FIGS. 9A and 9B show parts of the bit line contact area 4 in FIG. 8, which are enlarged and rotated by 90 degrees. An opposite pair of the bit line contacts 6 may be provided such that one pair is sifted in a bit line direction (y-direction in FIG. 9A) from another pairs located adjacent in a word line direction (x-direction in FIG. 9A) as shown in FIG. 9A or may be provided such that a certain number (four in FIG. 9B) of contacts pairs are sifted each other in the bit line direction as shown in FIG. 9B.

Similarly, the word lines WL are disposed on a memory block 2 provided immediately above the row-related control circuits R connected via the word line contacts 7 and extended to an adjacent memory block 2 on the opposite side. The word lines WL commonly provided on two memory blocks 2 are commonly selected and driven by one row-related control circuit R. Namely, one row-related control circuit R is shared between memory cell arrays provided in adjacent memory blocks 2.

When the word lines WL are connected in this way, the word line contacts 7 formed in one word line contact area 5 are provided at every other one of plural word lines WL aligned in parallel. The word line contacts 7 may also have an arrangement of contacts as shown in FIGS. 9A and 9B.

With such the arrangement of the lines, a bit line driver and a word line driver for driving the bit lines BL and the word lines WL can be shared by two memory blocks 2. Therefore, the numbers and areas of bit line drivers and word line drivers can be reduced. The line contacts are provided at every other one of the bit lines BL and the word lines WL and accordingly the distance between lines and the distance between contacts can be made larger in the bit line contact area 4 and the word line contact area 5.

(Another Example 3 of Connection Lines)

Figure 10:
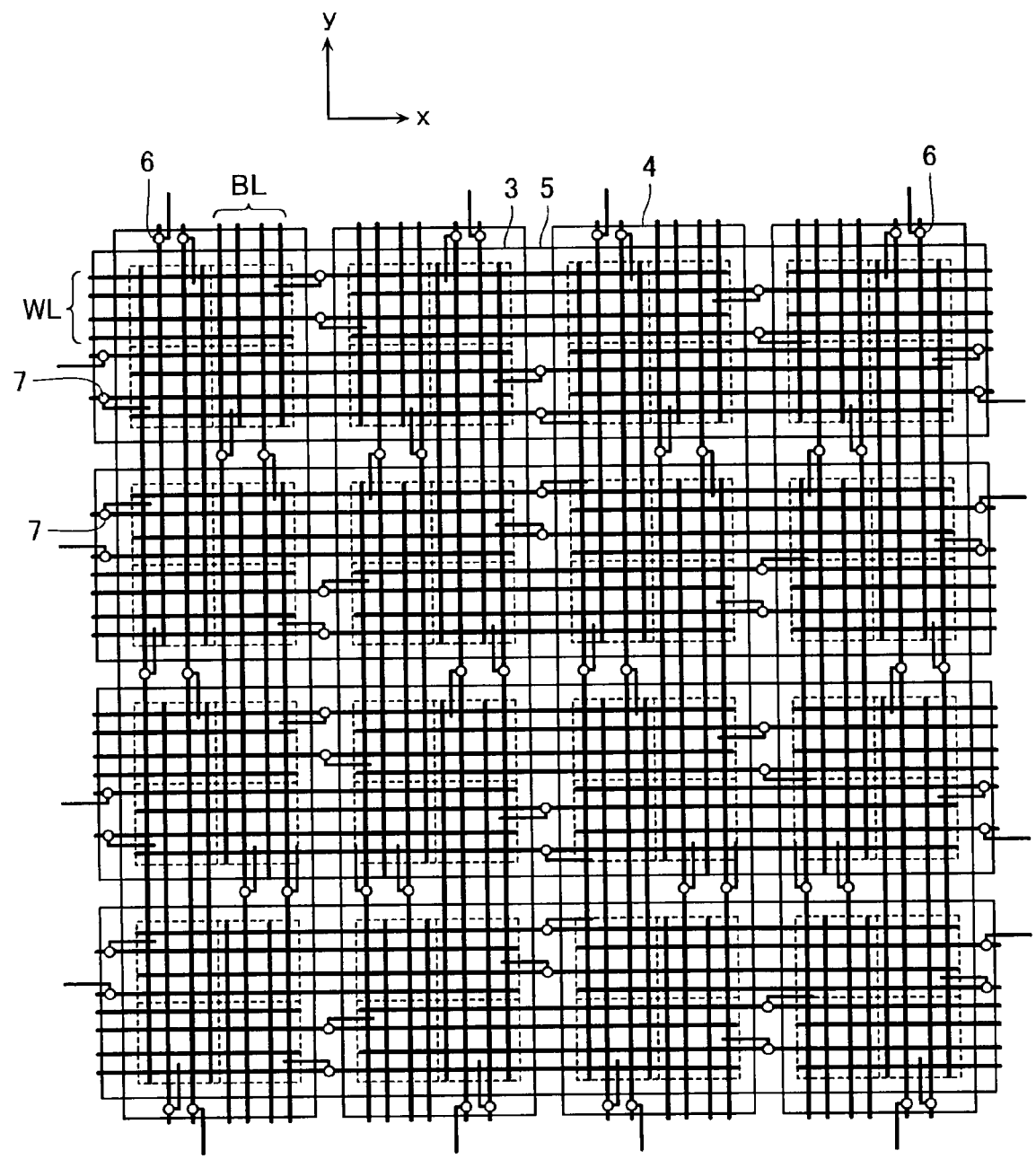
FIG. 10 is a plan view illustrative of an arrangement example of column-related/row-related control circuits in the resistive memory device.

The following description is given to yet another example of connection lines between the column-related control circuits C and row-related control circuits R arranged in a checkerboard form and the memory block 2. FIG. 10 shows lines for connecting the column-related control circuits C and row-related control circuits R formed in the control circuit area 3 to the memory block 2. In FIG. 10 the symbols (C, R) denoting the column-related control circuits C and the row-related control circuits R are omitted from the figure, though the arrangement of the column-related control circuits C and the row-related control circuits R is similar to those in FIGS. 6 and 7.

The bit lines BL are disposed on four memory blocks 2 that are adjacent to each other about the bit line contact 6. The bit lines BL commonly disposed on four memory blocks 2 are commonly selected and driven by one column-related control circuit C. Namely, one column-related control circuit C is shared among memory cell arrays provided on four memory blocks 2 that are adjacent to each other in the y-direction.

When the bit lines BL are connected in this way, the bit line contacts 6 formed in one bit line contact area 4 are provided at every other one of plural bit lines BL aligned in parallel.

Figure 11A:
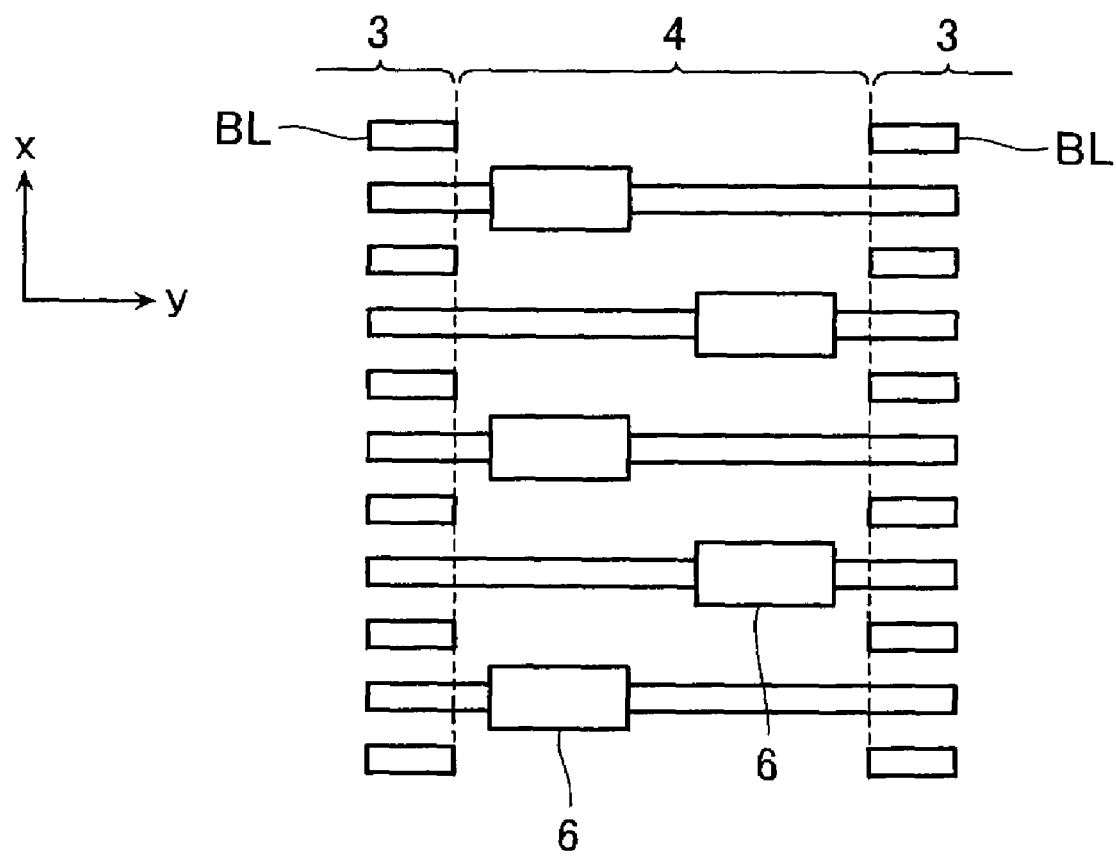
FIGS. 11A and 11B provide plan views illustrative of arrangement examples of line contacts in the resistive memory device.
Figure 11B:
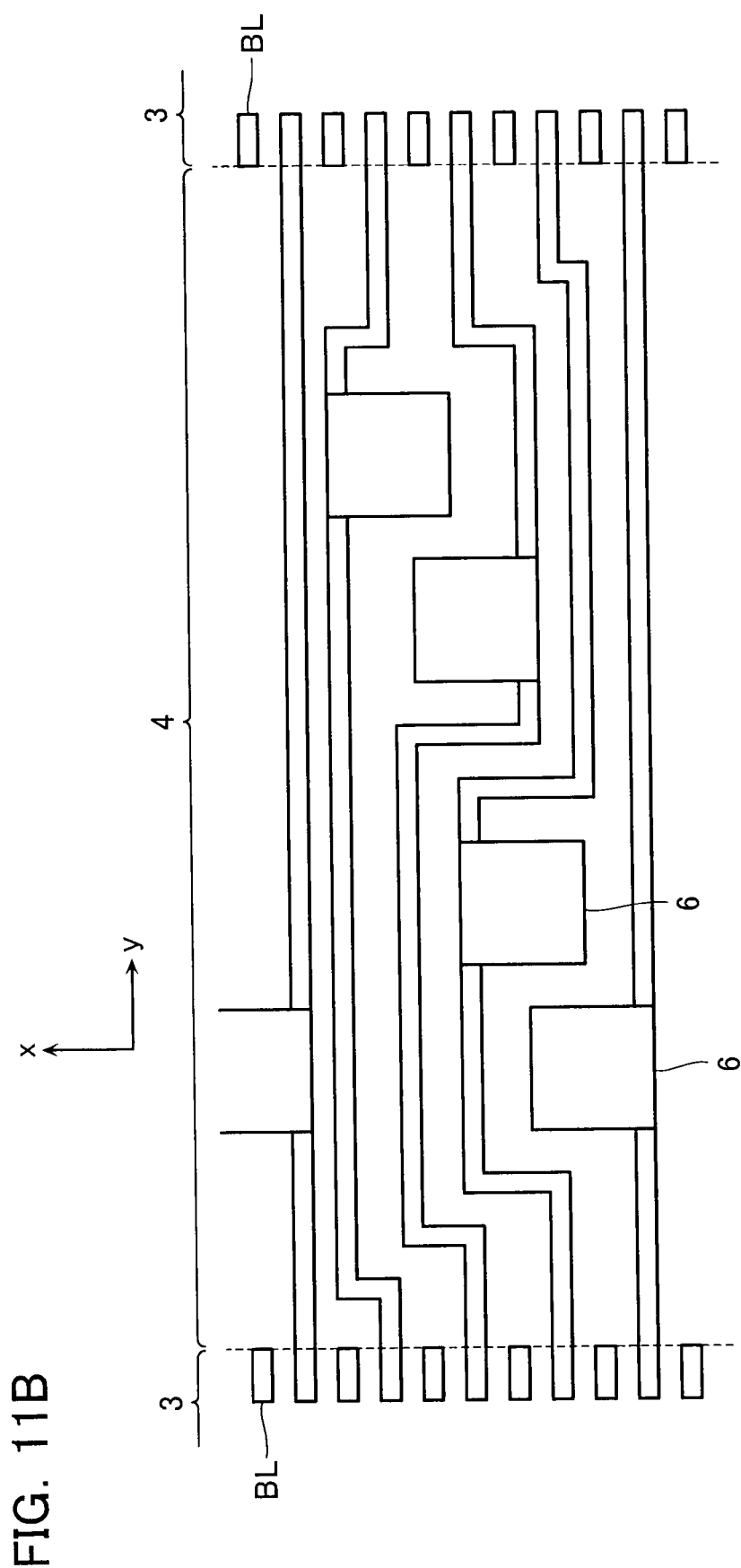

FIGS. 11A and 11B are plan views showing arrangement examples of bit line contacts 6 provided at every other one of plural bit lines BL. FIGS. 11A and 11B show parts of the bit line contact area 4 in FIG. 10, which are enlarged and rotated by 90 degrees. The bit line contacts 6 may be provided such that one is sifted in the bit line direction from another adjacent one as shown in FIG. 11A or may be provided such that a certain number (four in FIG. 11B) of contacts are sifted each other in the bit line direction as shown in FIG. 11B.

Similarly, the word lines WL are disposed on four memory blocks 2 that are adjacent to each other about the word line contact 7. The word lines WL commonly disposed on four memory blocks 2 are commonly selected and driven by one row-related control circuit R. Namely, one row-related control circuit R is shared among four memory blocks 2 that are adjacent to each other in the x-direction.

When the word lines WL are connected in this way, the word line contacts 7 formed in one word line contact area 5 are provided at every other one of plural word lines WL aligned in parallel. The word line contacts 7 may also have an arrangement of contacts as shown in FIGS. 11A and 11B.

With such the arrangement of the lines, a bit line driver and a word line driver for driving the bit lines BL and the word lines WL can be shared by four memory blocks 2. Therefore, the numbers and areas of bit line drivers and word line drivers can be reduced. The line contacts are provided at every other one of the bit lines BL and the word lines WL and accordingly the distance between lines and the distance between contacts can be made larger in the bit line contact area 4 and the word line contact area 5.

Second Embodiment (Second Arrangement Example of Control Circuits)

The following description is given to a second embodiment, that is, another example of the arrangement of column-related control circuits C and row-related control circuits R provided beneath the memory block 2.

Figure 12:
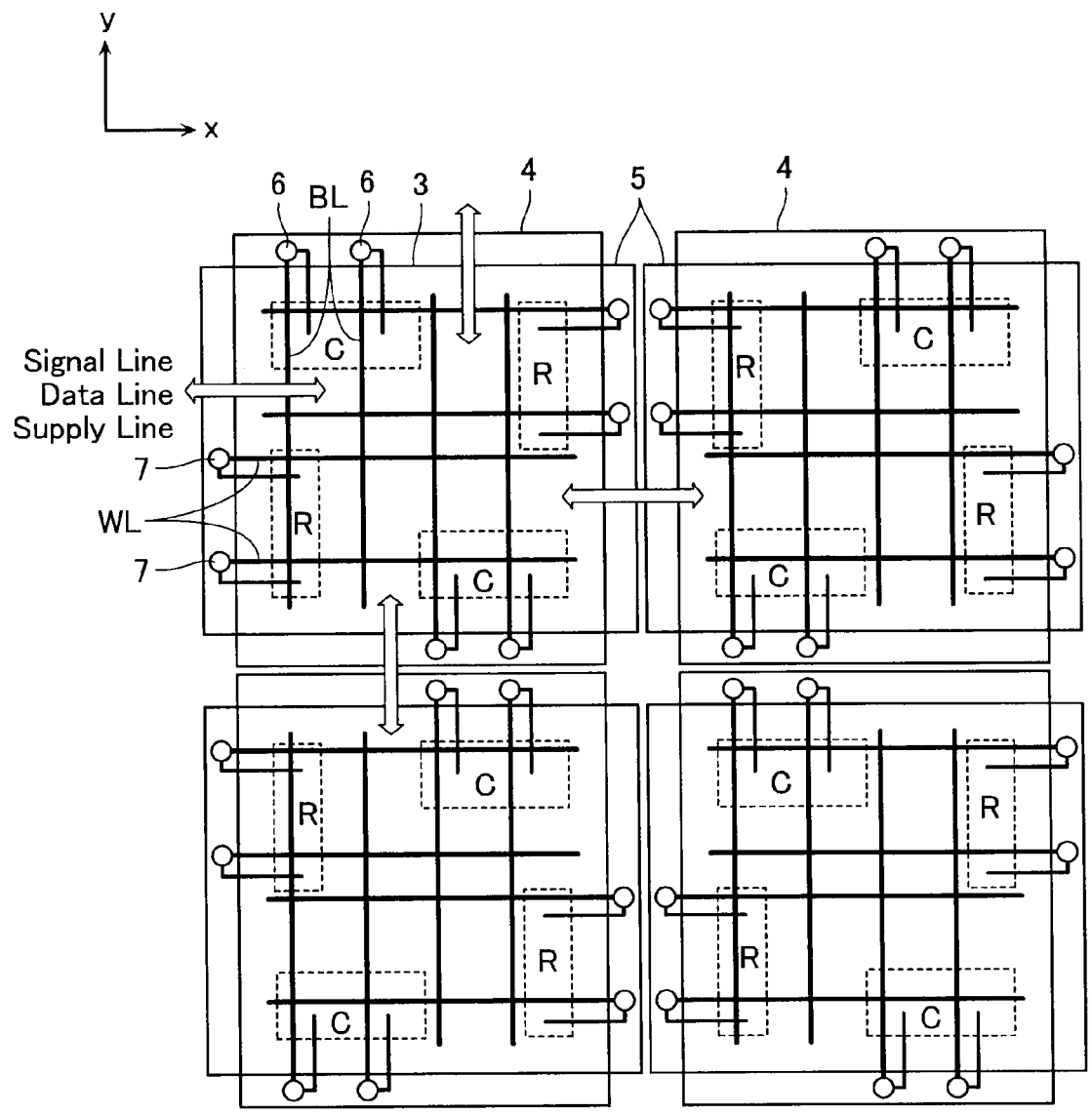
FIG. 12 is a plan view illustrative of an arrangement example of column-related/row-related control circuits in the resistive memory device.

FIG. 12 is a plan view showing an example of the arrangement of the column-related control circuits C and the row-related control circuits R in the control circuit area 3. FIG. 12 also shows lines for connecting the column-related control circuits C and row-related control circuits R formed in the control circuit area 3 to the memory block 2.

The column-related control circuits C and the row-related control circuits R shown in FIG. 12 are similar to those in the first embodiment shown in FIGS. 5 and 6 and the column-related control circuits C and the row-related control circuits R are aligned on respective diagonal lines and arranged in a checkerboard form in the control circuit area 3. The column-related control circuits C and row-related control circuits R formed in two adjacent control circuit areas 3 are arranged in checkerboard forms in different patterns. Namely, in two control circuit areas 3 that are adjacent to each other, the column-related control circuits C and the row-related control circuits R are formed line-symmetric about the boundary of the areas as the axis of symmetry.

The size of the column-related control circuit C in the row (y) direction and the size of the row-related control circuit R in the column (x) direction shown in FIG. 12 are formed smaller than those of the column-related control circuit C and the row-related control circuit R shown in FIGS. 5 and 6, different from the column-related control circuit C and the row-related control circuit R shown in FIGS. 5 and 6. The column-related control circuit C and the row-related control circuit R shown in FIG. 12 are not brought into contact with each other and leave space therebetween.

Also in the present example, the bit line contacts 6 are formed in the bit line contact areas 4 adjacent to the column-related control circuits C. In one bit line contact area 4, the bit line contacts 6 are formed concentratively only in one-half of the area.

Similarly, the word line contacts 7 are formed in the word line contact areas 5 adjacent to the row-related control circuits R. In one word line contact area 5, the word line contacts 7 are formed concentratively only in one-half of the area.

Also with such the arrangement, the column-related control circuits C and the row-related control circuits R are provided beneath one memory block 2, and plural memory blocks 2 can be configured independently controllable by the column-related control circuits C/row-related control circuits R provided per memory block 2. In addition, there is no need for separately providing a control circuit operative to control the memory block 2 at the outermost circumference and thus the chip area can be reduced.

The arrangement of the column-related control circuits C and the row-related control circuits R in the present example includes space provided between the column-related control circuit C and the row-related control circuit R. This space can be utilized to lead in control lines such as signal lines, data lines and supply lines in the control circuit area 3. The arrangement of the control circuits shown in FIG. 12 includes space on the opposite side from the column-related control circuit C and the row-related control circuit R. Accordingly, it is possible to lead in signal lines, data lines and supply lines from portions free of contacts in the bit line contact area 4 and the word line contact area 5.

Third Embodiment (Third Arrangement Example of Control Circuits)

The following description is given to a third embodiment, that is, yet another example of the arrangement of column-related control circuits C and row-related control circuits R provided beneath the memory block 2.

Figure 13:
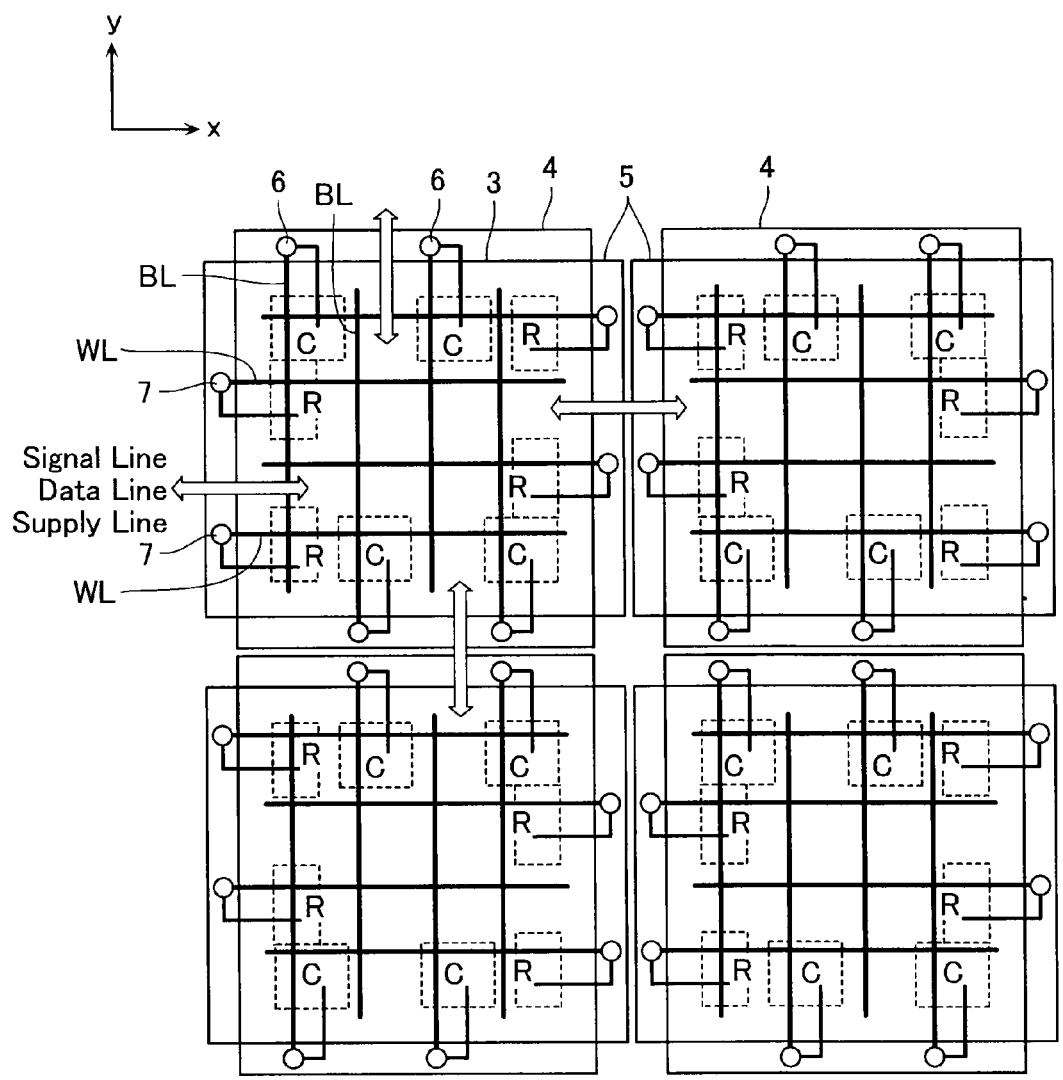
FIG. 13 is a plan view illustrative of an arrangement example of column-related/row-related control circuits in the resistive memory device.

FIG. 13 is a plan view showing an example of the arrangement of the column-related control circuits C and the row-related control circuits R in the control circuit area 3. FIG. 13 also shows lines for connecting the column-related control circuits C and row-related control circuits R formed in the control circuit area 3 to the memory block 2.

The column-related control circuits C and the row-related control circuits R shown in FIG. 13 are arranged in a pattern obtained by dividing the column-related control circuits C and the row-related control circuits R shown in FIG. 12 into halves, and one-half of the column-related control circuits C and the row-related control circuits R are shifted to the opposite side of the control circuit area 3. The column-related control circuits C and the row-related control circuits R shown in FIG. 13 are also provided with space therebetween. In two control circuit areas 3 that are adjacent to each other, the column-related control circuits C and the row-related control circuits R are formed line-symmetric about the boundary of the areas as the axis of symmetry.

Also with such the arrangement, the column-related control circuits C and the row-related control circuits R are provided beneath one memory block 2, and plural memory blocks 2 can be configured independently controllable by the column-related control circuits C/row-related control circuits R provided per memory block 2. The arrangement of the column-related control circuits C and the row-related control circuits R in the present example also includes space provided between the column-related control circuit C and the row-related control circuit R. This space can be utilized to lead in control lines such as signal lines, data lines and supply lines in the control circuit area 3.

As can be found from the arrangement of the column-related control circuits C shown in FIGS. 5-13, the column-related control circuits C in the control circuit area 3 may be arranged to cover plural bit lines BL formed in parallel in the x-direction. Similarly, the row-related control circuits R in the control circuit area 3 may be arranged to cover plural word lines WL formed in parallel in the y-direction. As long as this condition can be satisfied, the arrangement of the column-related control circuits C and the row-related control circuits R in the control circuit area 3 can be changed variously.

Fourth Embodiment (Fourth Arrangement Example of Control Circuits)

The following description is given to a fourth embodiment, that is, yet another example of the arrangement of column-related control circuits C and row-related control circuits R provided beneath the memory block 2.

Figure 14:
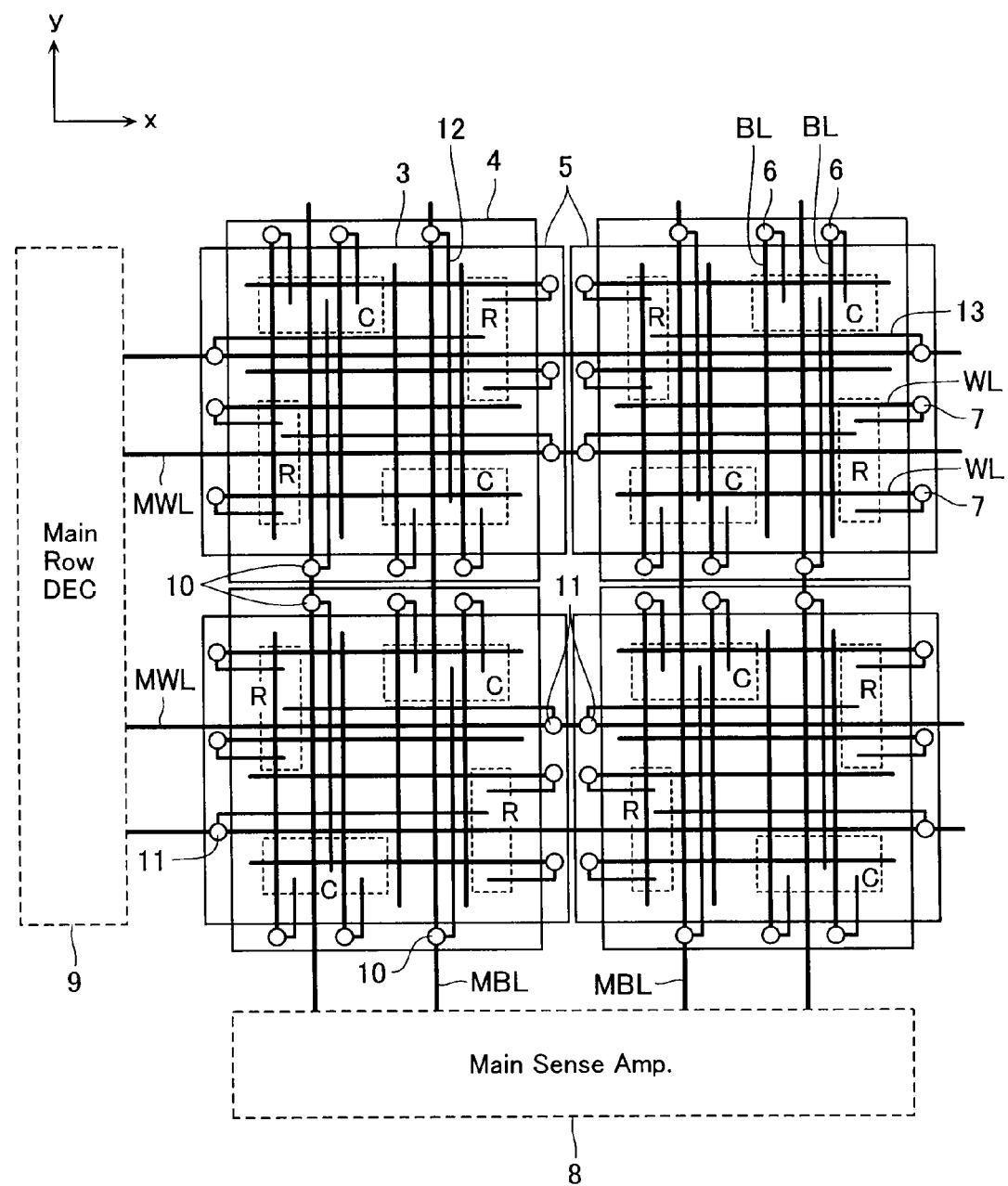
FIG. 14 is a plan view illustrative of an arrangement example of column-related/row-related control circuits in the resistive memory device.

FIG. 14 is a plan view showing an example of the arrangement of the column-related control circuits C and the row-related control circuits R in the control circuit area 3. The arrangement of the bit lines BL, the word lines WL, the column-related control circuits C and the row-related control circuits R shown in FIG. 14 is similar to the arrangement shown in the second arrangement example of the control circuits.

The arrangement example of the column-related control circuits C and the row-related control circuits R in the present example is different from the second arrangement example of the control circuits shown in FIG. 12 in the following point.

In the fourth arrangement example shown in FIG. 14, there are provided plural main bit lines MBL, which are commonly connected to plural column-related control circuits C aligned in the y-direction among the column-related control circuits C in the control circuit areas 3 provided in matrix.

The main bit lines MBL are provided in a wiring layer above the main block 2 and connected to main bit line contacts 10 (vertical lines) provided in the bit line contact area 4 opposite to the bit line contact area 4 in which local bit line contacts 6 are formed. The main bit lines MBL are connected to the column-related control circuits C on the semiconductor substrate 1 via the main bit line contact 10 and lower-layer lines 12 that extend in the direction along the bit line wired beneath the memory block 2.

Similarly, there are provided plural main word lines MWL, which are commonly connected to plural row-related control circuits R aligned in the x-direction among the row-related control circuits R in the control circuit areas 3 provided in matrix.

The main word lines MWL are provided in a wiring layer above the main block 2 and connected to main word line contacts 11 (vertical lines) provided in the word line contact area 5 opposite to the word line contact area 5 in which local word line contacts 7 are formed. The main word lines MWL are connected to the row-related control circuits R on the semiconductor substrate 1 via the main word line contact 11 and lower-layer lines 13 that extend in the direction along the word line wired beneath the memory block 2.

The main bit lines MBL have one end connected to a main sense amplifier 8 provided on the semiconductor substrate 1. The main sense amplifier 8 is used to select and drive the main bit lines MBL. The main word lines MWL have one end connected to a main row decoder 9 provided on the semiconductor substrate 1. The main row decoder 9 is used to select and drive the main word lines MWL.

Namely, the bit lines and word lines in the present arrangement example have a hierarchical structure by the main bit lines MBL/main word lines MWL commonly connected to plural memory blocks 2 and the bit lines BL/word lines WL provided on each memory block 2.

In the present example, the control circuit arrangement is similar to FIG. 12. Accordingly, the column-related control circuits C and the row-related control circuits R are provided beneath one memory block 2, and plural memory blocks 2 can be configured independently controllable by the column-related control circuits C/row-related control circuits R provided per memory block 2. The arrangement of the column-related control circuits C and the row-related control circuits R in the present example also includes space provided between the column-related control circuit C and the row-related control circuit R. This space can be utilized to lead in control lines such as signal lines, data lines and supply lines in the control circuit 3.

Also in the present example, the bit lines/word lines may have a hierarchical structure to reduce the area of the column-related control circuits C and the row-related control circuits R provided beneath one memory block 2.

The main bit line contacts 10 shown in FIG. 14 are formed on the opposite side of the bit line contact area 4 from the region in which the bit line contacts 6 are concentrated. Similarly, the main word line contacts 11 are formed on the opposite side of the word line contact area 5 from the region in which the word line contacts 7 are concentrated.

Therefore, contacts are not concentrated in the bit line contact area 4 and the word line contact area 5 and contacts can be arranged easier. With the control circuits and wiring structures shown in FIG. 14, even if the bit lines and word lines have a hierarchical structure, the main bit lines MLB/main word lines MWL can be connected to the column-related control circuits C/row-related control circuits R via contacts.

The embodiments of the present invention have been described above though the present invention is not limited to these but rather can be given various modifications, additions, combinations and so forth without departing from the scope and spirit of the invention.

What is claimed is:

1. A semiconductor memory device, comprising:
a semiconductor substrate;
a plurality of memory cell arrays stacked on said semiconductor substrate and arranged in a matrix, each memory cell array including a plurality of first lines paralleled with each other, a plurality of second lines paralleled with each other and formed crossing said first lines, and a plurality of memory cells arranged at intersections of said first lines and said second lines, each memory cell having one end connected to one of said first lines and the other end connected to one of said second lines;
a first control circuit provided on said semiconductor substrate immediately beneath said memory cell arrays and having one end connected to said first lines to select and drive said first lines; and
a second control circuit provided on said semiconductor substrate immediately beneath said memory cell arrays and having one end connected to said second lines to select and drive said second lines;
a plurality of third lines commonly connected to said first control circuit located immediately beneath plural memory cell arrays in the same column of said memory cell arrays arranged in a matrix;
a plurality of fourth lines commonly connected to said second control circuit located immediately beneath plural memory cell arrays in the same row of said memory cell arrays arranged in a matrix;
a third control circuit connected to one end of said third lines to select and drive said third lines; and
a fourth control circuit connected to one end of said fourth lines to select and drive said fourth lines.

2. The semiconductor memory device according to claim 1, wherein said memory cell arrays are independently controlled by said first control circuit and said second control circuit located immediately beneath.

3. The semiconductor memory device according to claim 1, wherein said first control circuit and said second control circuit are arranged in a checkerboard form on said semiconductor substrate immediately beneath said memory cell arrays.

4. The semiconductor memory device according to claim 1, wherein said first control circuit and said second control circuit provided immediately beneath one of said memory cell arrays and said first control circuit and said second control circuit provided immediately beneath another one of said memory cell arrays adjacent to said one of said memory cell arrays are arranged line-symmetric about the boundary between adjacent two of said memory cell arrays as the axis of symmetry.

5. The semiconductor memory device according to claim 1, further comprising:
a plurality of line contact areas provided adjacent to four sides of an area immediately beneath said memory cell array;
a plurality of first line contacts provided in said line contact areas to connect said first lines to said first control circuit; and
a plurality of second line contacts provided in said line contact areas to connect said second lines to said second control circuit,
wherein said first and second line contacts are formed concentratively in a first portion of said line contact areas, wherein said first control circuit and said second control circuit are connected to external via control lines provided in a second portion of said line contact areas.

6. The semiconductor memory device according to claim 1, further comprising:
- a plurality of line contact areas provided adjacent to four sides of an area immediately beneath said memory cell array;
- a plurality of first line contacts provided in said line contact areas to connect said first lines to said first control circuit; and
- a plurality of second line contacts provided in said line contact areas to connect said second lines to said second control circuit,
- wherein said first line contacts connected to said first lines arranged in parallel are provided on every other one of said first lines within one of said line contact areas,
- wherein said second line contacts connected to said second lines arranged in parallel are provided on every other one of said second lines within one of said line contact areas.

7. The semiconductor memory device according to claim 1, wherein said first control circuit is arranged within a range connectable to said first lines aligned in one direction,
- wherein said second control circuit is arranged within a range connectable to said second lines aligned in another direction crossing said one direction.

8. The semiconductor memory device according to claim 1, further comprising:
- a plurality of line contact areas provided adjacent to four sides of an area immediately beneath said memory cell array;
- a plurality of first line contacts provided in said line contact areas to connect said first lines to said first control circuit; and
- a plurality of second line contacts provided in said line contact areas to connect said second lines to said second control circuit,
- wherein said first and second line contacts are formed concentratively in a first portion of said line contact areas, wherein said first control circuit and said second control circuit are connected to said third line and said fourth line via contacts provided in a second portion of said line contact areas.

9. A semiconductor memory device, comprising:
- a semiconductor substrate;
- a plurality of memory cell arrays stacked on said semiconductor substrate, each memory cell array including a plurality of first lines paralleled with each other, a plurality of second lines paralleled with each other and formed crossing said first lines, and a plurality of memory cells arranged at intersections of said first lines and said second lines, each memory cell having one end connected to one of said first lines and the other end connected to one of said second lines;
- a first control circuit provided on said semiconductor substrate and having one end connected to said first lines to select and drive said first lines;
- a second control circuit provided on said semiconductor substrate and having one end connected to said second lines to select and drive said second lines;
- a plurality of line contact areas provided adjacent to four sides of an area immediately beneath said memory cell array;
- a plurality of first line contacts provided in said line contact areas to connect said first lines to said first control circuit; and
- a plurality of second line contacts provided in said line contact areas to connect said second lines to said second control circuit,
- wherein said first and second line contacts are formed concentratively in a first portion of said line contact areas, wherein said first control circuit and said second control circuit are connected to external via control lines provided in a second portion of said line contact areas.

10. The semiconductor memory device according to claim 9, wherein said first and second control circuits are shared by adjacent ones of said memory cell arrays.

11. The semiconductor memory device according to claim 9, wherein said first and second control circuits are shared by plural ones aligned in one direction of said memory cell arrays.

12. The semiconductor memory device according to claim 9,
- wherein said first line contacts connected to said first lines arranged in parallel are provided on every other one of said first lines within one of said line contact areas,
- wherein said second line contacts connected to said second lines arranged in parallel are provided on every other one of said second lines within one of said line contact areas.

13. A semiconductor memory device, comprising:
- a semiconductor substrate;
- a plurality of memory cell arrays stacked on said semiconductor substrate, each memory cell array including a plurality of first lines paralleled with each other, a plurality of second lines paralleled with each other and formed crossing said first lines, and a plurality of memory cells arranged at intersections of said first lines and said second lines, each memory cell having one end connected to one of said first lines and the other end connected to one of said second lines;
- a first control circuit provided on said semiconductor substrate and having one end connected to said first lines to select and drive said first lines;
- a second control circuit provided on said semiconductor substrate and having one end connected to said second lines to select and drive said second lines;
- a plurality of line contact areas provided adjacent to four sides of an area immediately beneath said memory cell array;
- a plurality of first line contacts provided in said line contact areas to connect said first lines to said first control circuit; and
- a plurality of second line contacts provided in said line contact areas to connect said second lines to said second control circuit,
- said first line contacts connected to said first lines aligned in parallel being provided on every other one of said first lines within one of said line contact areas, and
- said second line contacts connected to said second lines arranged in parallel being provided on every other one of said second lines within one of said line contact areas.

14. The semiconductor memory device according to claim 13, wherein said first and second control circuits are shared by adjacent ones of said memory cell arrays.

15. The semiconductor memory device according to claim 13, wherein said first and second control circuits are shared by plural ones aligned in one direction of said memory cell arrays.

16. The semiconductor memory device according to claim 13, wherein said first control circuit and said second control circuit provided immediately beneath one of said memory cell arrays and said first control circuit and said second control circuit provided immediately beneath another one of said memory cell arrays adjacent to said one of said memory cell arrays are arranged line-symmetric about the boundary between adjacent two of said memory cell arrays as the axis of symmetry.

17. The semiconductor memory device according to claim 13, wherein said memory cell arrays are arranged in matrix, further comprising:
   a plurality of third lines commonly connected to said first control circuit located immediately beneath plural memory cell arrays in the same column of said memory cell arrays arranged in matrix;
   a plurality of fourth lines commonly connected to said second control circuit located immediately beneath plural memory cell arrays in the same row of said memory cell arrays arranged in matrix;
   a third control circuit connected to one end of said third lines to select and drive said third lines; and
   a fourth control circuit connected to one end of said fourth lines to select and drive said fourth lines.

18. The semiconductor memory device according to claim 8, wherein said first portion of said line contact areas are provided opposite side of said second portion of said line contact areas, respectively.

19. The semiconductor memory device according to claim 9, wherein said first control circuit and said second control circuit are arranged in a checkerboard form on said semiconductor substrate immediately beneath said memory cell arrays.

* * * * *